United States Patent [19]

Seefeldt

[11] Patent Number: 4,506,785
[45] Date of Patent: Mar. 26, 1985

[54] UNIVERSAL CIRCUIT PACK CONTAINER

[75] Inventor: Roger L. Seefeldt, Oklahoma City, Okla.

[73] Assignee: AT&T Technologies, Inc., New York, N.Y.

[21] Appl. No.: 518,190

[22] Filed: Jul. 28, 1983

[51] Int. Cl.³ .............................................. B65D 85/30
[52] U.S. Cl. ..................................... 206/334; 206/328; 206/454; 206/459; 211/41; 220/22.1
[58] Field of Search ................................ 206/328-334, 206/454, 455, 459; 211/40, 41; 220/22, 21.1, 22.3, 22.5; 40/312

[56] References Cited

U.S. PATENT DOCUMENTS

| | | | |
|---|---|---|---|
| 590,666 | 9/1897 | Macrae | 220/22.5 |
| 1,482,085 | 1/1924 | Marks | 206/459 |
| 2,491,750 | 12/1949 | McGavock | 220/22 |
| 3,014,594 | 12/1961 | Kerstner | 206/334 |
| 3,351,209 | 11/1967 | Kofoed et al. | 206/459 |
| 4,158,876 | 6/1979 | Pedro | 211/41 |
| 4,209,208 | 6/1977 | Fickler | 206/454 |
| 4,227,613 | 10/1980 | Seitz | 206/459 |
| 4,261,464 | 4/1981 | Maitland | 206/334 |
| 4,261,465 | 4/1981 | Thomas | 206/334 |
| 4,308,953 | 1/1982 | Cohen | 206/334 |
| 4,353,469 | 10/1982 | Etchinson, Jr. et al. | 211/41 |
| 4,382,517 | 5/1983 | Welsch | 211/41 |

FOREIGN PATENT DOCUMENTS

| | | | |
|---|---|---|---|
| 0712883 | 7/1965 | Canada | 220/22 |
| 1565411 | 3/1969 | France | 220/22.3 |
| 0614981 | 12/1948 | United Kingdom | 220/22.3 |
| 2023102A | 12/1979 | United Kingdom | 206/328 |

Primary Examiner—William T. Dixson, Jr.
Assistant Examiner—Jimmy G. Foster
Attorney, Agent, or Firm—R. P. Miller; M. de Picciotto

[57] ABSTRACT

A circuit board container assembly includes a box (10) with internal side wall slots (16 and 17) for receiving dividers (21 and 22) in which are formed vertical slots (28, 29, 31 and 32) and into which are placed printed circuit boards (11). Thee dividers are color coded to indicate discrete offset positionings of edge tabs (23, 24, 26 and 27) on the respective dividers. The offset positioning of the edges permits the selection of dividers which are mounted in the wall slots to provide spacings of the bottoms of the divider slots at distances closely proximating the width of the circuit boards placed in the slots so that the boards are snugly held during transport of the box.

9 Claims, 5 Drawing Figures

UNIVERSAL CIRCUIT PACK CONTAINER

FIELD OF INVENTION

This invention relates to a container for receiving a number of printed circuit boards and snugly supporting the boards during subsequent transport of the container, and more particular, to a container assembly having circuit board insert support plates which may be selectively positioned to accommodate groups of circuit boards of different widths.

BACKGROUND OF THE INVENTION

During the manufacture of printed circuit boards, the boards must be transported from one assembly or fabricating station to another, e.g., from a component insertion station to a wave soldering station where loosely mounted components are solder bonded to the board. As the various assembly operations are completed, the value of the board increases considerably and great care must be exercised in handling the circuit boards to avoid any damage. The boards upon completion of each fabricating step are often placed in containers for transport to the next succeeding fabricating station. Thus the container must be designed to snugly hold the circuit boards during transport.

A problem exists in that various groups or codes of boards differ in size from one coded group to the next. It may be thus appreciated that it would be desirable to provide a transport container that may be easily modified to accommodate groups of circuit boards of different widths. Such a versatile or universal circuit board container is the subject of the present invention.

Various containers have been designed to receive and support a number of printed circuit boards for transport and/or subsequent storage. In one such container, as disclosed in U.S. Pat. No. 4,029,208 issued June 14, 1977 to H. Fickler et al., there is shown a plastic rectangular box having a pair of opposed grooved walls for receiving a pair of vertically grooved partitions. The partitions are placed in the walled grooves at distances approximating the widths of the circuit boards, whereafter, the boards may be slid into the support within the partition grooves.

In another circuit board container construction, as shown in U.S. Pat. No. 4,261,464 issued Apr. 14, 1981 to D. E. Maitland, a box is provided with equally spaced vertically extending grooves formed in the four interior box walls. A pair of locator members are fabricated with projecting pairs of tongues extending from opposite edges which are selectively seated in pairs of grooves formed in the opposed box walls. The locators are formed with closely spaced second tongues to project toward each other and thus provide sets of grooves for receiving end structures formed on opposite edges of a divider board. Grooves of different depths are formed on opposite sides of the divider board for receiving first ends of circuit boards while the other ends are received in the grooves formed in the box walls. By reversing the divider board, circuit boards of slightly different lengths can be accommodated.

There is still a need for a circuit board tote box assembly which can be quickly and accurately assembled with a minimum number of component parts to accommodate and snugly support the groups of circuit boards of different lengths.

SUMMARY OF INVENTION

This invention contemplates, among other things, a circuit board tote box assembly comprising a pair of vertically grooved dividers having projecting edge tongues which are offset from the center planes of the dividers and which may be selectively seated in opposed evenly spaced grooves formed in opposite interior side walls of a box to receive and snugly support groups of circuit boards having different widths.

More particularly, a plastic tote box is constructed with vertically extending grooves in a pair of opposed interior side walls. Color coded dividers with vertically extending circuit board receiving grooves are fabricated with oppositely projecting edge tongues. The pair of tongues on each divider are offset by a predetermined amount from the center plane of the board. The opposite sides of the divider are numerically code marked.

In use, the circuit boards are measured to provide information as to the proper selection of a pair of color coded dividers. The measured information also provides an indication of the manner of facing the appropriate sides of the dividers to provide a spacing between the dividers when mounted in the box which will permit the snug support of the circuit boards. The pair of dividers are mounted in the box by sliding the tongues along opposite side wall grooves, whereupon, the dividers are seated and spaced apart a distance closely proximating the width of the circuit board. Due to the proper selection of the color coded dividers and the appropriate facing of the divider grooves, pairs of grooves are presented to receive opposite edges of the circuit boards and snugly hold the boards during subsequent transport of the tote box.

BRIEF DESCRIPTION OF THE DRAWING

Other advantages and features of the invention will be apparent upon consideration of the following detailed specification in conjunction with the drawing wherein.

DETAILED DESCRIPTION OF THE INVENTION

Figure 1:
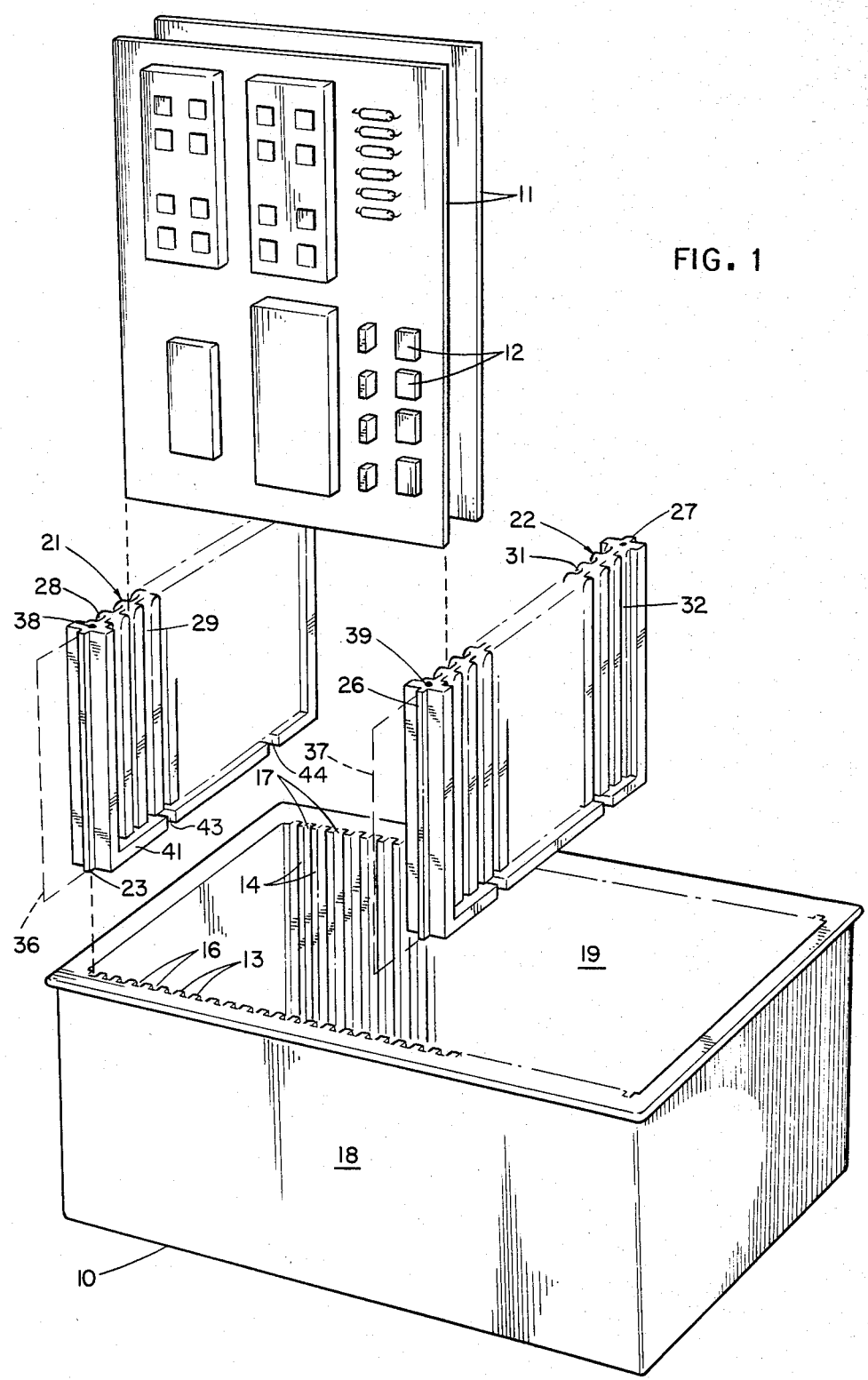
FIG. 1 is an exploded perspective view of a printed circuit board tote box embodying the principles of the present invention.
Figure 4:
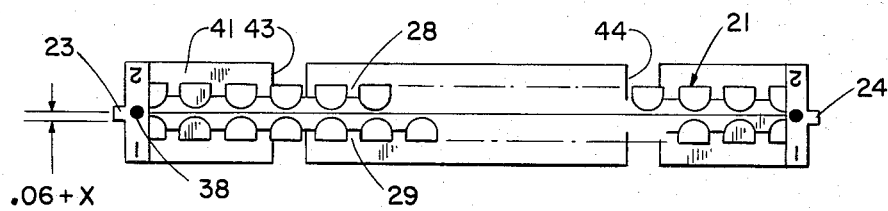
FIG. 4 is a top view of a divider illustrating a pair of offset mounting tongues.
Figure 5:
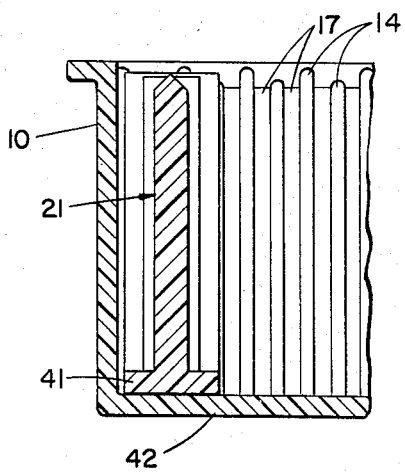
FIG. 5 is a sectional view taken along line 5—5 of FIG. 3 showing a cross-section of a color and numerically coded divider seated within the tote box.

Referring to the drawings and particularly to FIG. 1 there is shown a rectangular container 10 for receiving and supporting circuit boards 11 having components 12 mounted thereon. The container is constructed of moldable plastic and is provided with vertically extending and aligned sets of rounded top ribs 13 and 14 to define slots 16 and 17 formed in opposed side walls 18 and 19. The slots 16 and 17 may be formed on quarter (¼) inch centers. The slots 16 and 17 are adapted to receive a pair of insert plates or dividers 21 and 22. More specifically, the insert plate 21 is fabricated at opposite ends with a pair of slide tabs or tongues 23 and 24 (see also FIG. 4) that are snugly fittable in a first pair of aligned, opposed slots 16 and 17 while the insert plate 22 is fabricated at opposite ends with a pair of slide tabs 26 and 27 that are snugly fittable in a second pair of aligned, opposed slots 16 and 17. The spacing between the inserted pair of plates 21 and 22 approximates the width of each board 11 of a group of circuit boards that are to be loaded into the container for subsequent transport to a fabricating station or a storage area. The insert plate 21 is provided on both sides with sets of vertically extending slots 28 and 29 of uniform depth and width. In a like manner, the insert plate 22 is provided on both sides with sets of vertically extending slots 31 and 32 of uniform depth and width. When a pair of insert plates 21 and 22 are slid into two pairs of spaced slots 16 and 17, printed circuit boards such as designated by the reference numeral 10 may be slid into pairs of facing aligned slots 29 and 31.

However, due to the ¼ inch spacing between the container side wall slots 16 or 17, the circuit boards may still shift during transport resulting in possible damage or dislodgement of the components mounted on the circuit boards. What is needed is a more precise spacing between the insert plates 21 and 22 to prevent shifting of the board. This desirable result is obtainable by offsetting the slide tabs 23-24 and 26-27 by different amounts from center planes 36 and 37 passing through the respective plates 21 and 22.

More particularly, the slide tabs 23 and 24 on the plate 21 are offset a first amount, e.g., 0.09125, from the plane 36 passing through the plate, and the slide tabs 26 and 27 on the plate 22 are offset a different amount, e.g., 0.125, from the plane 37 passing through the center of the plate. By selecting different combinations of insert plates 21 and 22 and placing the plates within the slots 16 and 17 with different arrangements of side facings, it is possible to provide pairs of facing slots 29 and 31 which will receive a group of boards and hold the boards snugly during transport. The plates 21 and 22 are color and numerically coded; plate 21 may be molded with a blue tint or marked with a blue colored spot 38 and the plate 22 is molded with a yellow tint or marked with a yellow spot 39. The respective sides of the plate are numerically designated 1 and 2 (see FIG. 4).

Each divider plate, such as plate 21, is molded with an oppositely extending bottom flange 41 having a flat surface which may be abutted against a bottom panel 42 of the container. The flange is provided with a pair of transverse slots 43 and 44 to accommodate rails 46 and 47 formed to extend along the bottom panel 42. When a divider plate 21 or 22 is mounted in the container, the walls of slots in the flanges lock along the rails to increase stability and preclude bowing of the divider plate. The flange construction is also continued along opposite edges to provide flat outer surfaces with abut against the ribs 13 and 14 of the side walls 18 and 19.

The containers 10 are constructed of a low density polyethylene which has a foam-like interior with a hard slick surface having a surface resistivity of $10^5$ to $10^{14}$ ohms per square. In order to obtain this resistivity, a conductive or antistatic additive such "Benstat" material, manufactured by Bengal Corporation of Chatsworth, Calif., or "Armostat" material manufactured by the Armark Company of Burt, N.Y. are combined in small amounts (e.g., 0.3% of the weight of the polyethylene) with the polyethylene. This construction provides a light container having low friction surfaces wherein the plates 21 and 22 and the circuit board 33 may be easily assembled. It has been found that the hard surface on the container is a fair conductor of electricity so that electrostatic charges imparted to the container wall will be dissipated prior to passage to the circuit boards mounted within the container. Such a charge may originate from the user operator handling the container. Even small electrostatic charges if permitted to pass to the component mounted on the circuit boards may cause damage. In use, any charge imparted to the container will drain along the hard outer surface to a metallic support surface, such as a metal surface on a workbench or metallic transport skid.

Figure 2:
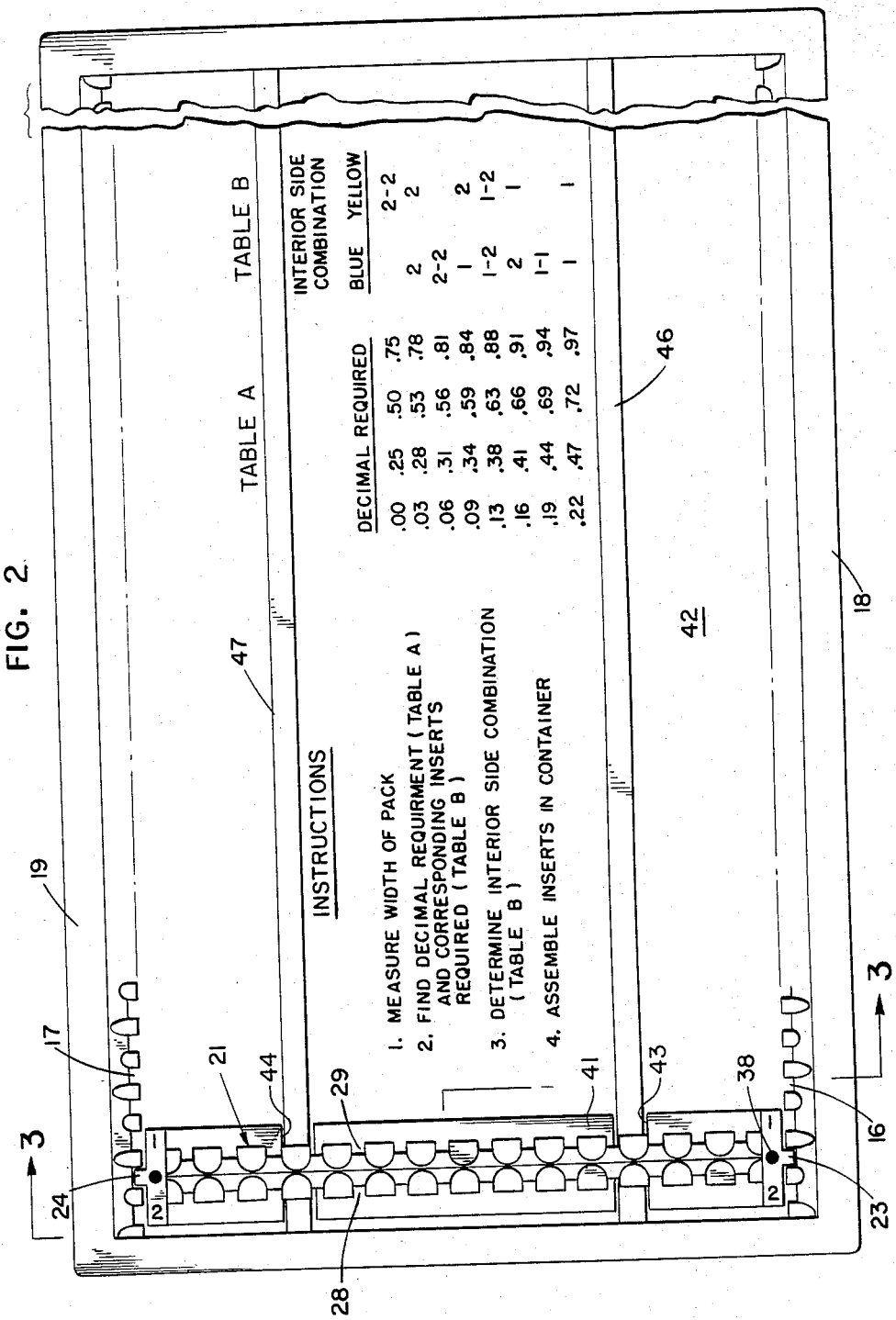
FIG. 2 is a top view showing the bottom of the tote box with instructions imprinted therein to enable one to select a pair of dividers to mount within the box and insure that the circuit boards are snugly held within the box.
Figure 3:
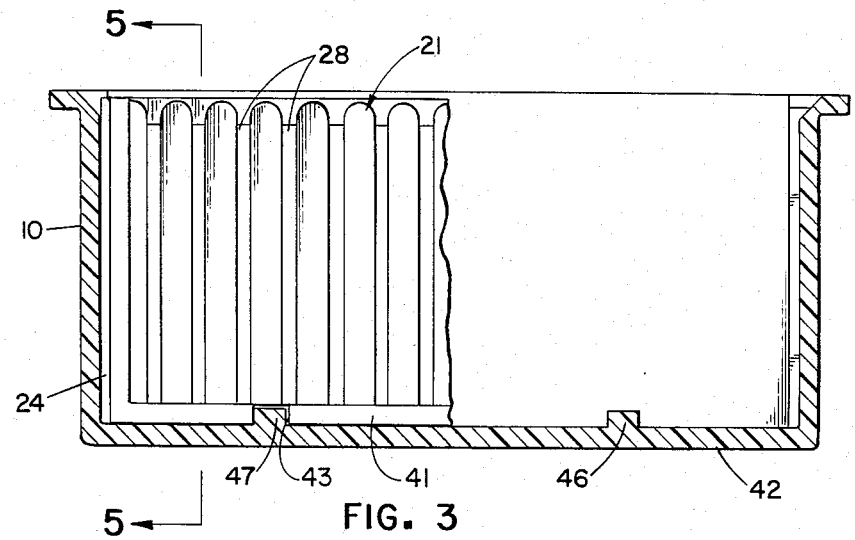
FIG. 3 is a sectional view taken along plane 3—3 of FIG. 2 showing a divider seated within the tote box.

In use, a group of boards of uniform widths to be transported are measured and the fractional inch dimension is converted to a decimal. Knowing the decimal and looking at the chart shown in FIG. 2, the proper pair of insert plates and plate facings may be determined. The characters for the chart are molded as intaglios in or embossments on the bottom of the container. In the alternative, the chart may also be formed as a separate piece and secured to the bottom of the container. More explicitly, assume that the board is 3⅝ inches in length, or stated as a decimal, 3.625 inches in length. Taking the decimal 0.625 and referring to the chart in FIG. 3, it will be noted that the decimal designation 0.63 is the closest. The plate and facings arrangements may be then obtained by reading the notations to the right which indicates that a blue plate and a yellow plate should be selected and inserted in the container 10 so that side two on the blue plate faces side one on the yellow plate.

The attending operator places the first plate 21 into a pair of aligned slots 16 and 17. A sample board is then placed in a slot 29 and then the second plate is slid into a second pair of slots 16 and 17 so that the far end of the printed circuit board is received and seated within a slot 31. With the proper selection of plates 21 and 22, the edges of the printed circuit board will be fully seated within the aligned pairs of slots 29 and 31, and there will be a minimum amount of shifting of the boards during subsequent transport from one work location to the next.

As an alternative construction, the container may be marked with inch designations along the side walls 18 and 19 to apprise the operator as to the proper slot into which the second plate should be inserted. However, experience has shown that the user may set the pair of properly selected plates in the container with the aid of a sample board much faster than trying to figure out the proper slot selection from noting the inch dimension markings on the container. This is particularly true where more than a single pair of insert plates 21 and 23 are to be inserted to support more than one group of circuit boards.

Further, the container may be utilized to accommodate several groups of relatively narrow circuit boards in which instance more than two divider plates may be employed to divide the container into several components, each of which is of the proper size to receive one group of circuit boards. For example, two pairs insert plates 21 and 22 may be used and positioned to accommodate printed circuit boards of four different widths.

What is claimed is:

1. A container for receiving printed circuit boards, which comprises:

a box having a pair of opposed parallel side walls, said side walls having parallel evenly spaced grooves, the grooves on one wall being laterally aligned with the grooves on the other wall;

a pair of insert plates, each of said plates having slots formed on opposite sides that extend the entire lengths of said plates, said slots being of uniform depth and width;

a pair of first tabs projecting from opposite ends of a first of said insert plates and fittable within a pair of said side wall grooves; said tabs being offset from a center line plane running through said first plate by a first predetermined amount;

a pair of second tabs projecting from opposite ends of the other or second of said insert plates and fittable within a pair of said side wall grooves; said tabs being offset from a center line plane running through said second plate by a second predetermined amount which is the same or different from said first predetermined amount;

said first insert plate having a color marking indicative of the amount of offset of said pair of insert tabs on said first insert plate; and said second insert plate having a color marking wherein the color is distinguishable from the marking on the first plate to indicate the amount of offset of said pair of insert tabs on said second plate.

2. A container as defined in claim 1 wherein:

said first plate having a pair of characters imprinted thereon in positions adjacent to said pair of grooves on the opposite sides of said first plate to provide indications of the amounts of offset of said tabs with respect to the center plane of said insert plate and the opposite grooved sides of said first plate; and said second plate having a pair of characters imprinted thereon in positions adjacent to said pair of grooves on opposite sides of said second plate to provide an indication of the amount of offset of said tabs with respect to the center plane of said insert and the opposite grooves sides of said second plate.

3. A container as defined in claim 1 which includes:

pairs of flanges on the opposite ends of each of said insert plates; each flange projecting in opposite directions from an end of said insert plate a distance greater than the width of one of said slots formed in said side wall to extend beyond the adjacent slots when the tabs of a plate are inserted in a pair of aligned slots in said side wall slots; and one of said flanges on each of said insert plates is imprinted with a pair of characters to individually appear on the opposite extending sections of said flange; a first of said characters being indicative of the amount of offset of the tabs with respect to first side of said insert plate and a second of said characters being indicative of the amount of offset of the tabs with respect to a second opposite side of said insert plate.

4. A kit for assembling a container to receive printed circuit boards, which includes the structural elements set forth in claim 1 and further includes:

a second pair of insert plates identical in construction with the first pair of plates defined in claim 1 whereupon various combinations of pairs of plates may be selected and assembled within said box with the tabs on each plate being inserted within pairs of said aligned grooves to provide variations in the distances between said assembled plates, said second pair of plates being of colors identical with said first pair of plates.

5. A container for receiving circuit boards of a predetermined width, which comprises:

a box having a pair of parallel side walls, said walls having transversely extending slots that are evenly spaced, said slots in a first of said walls being laterally aligned with the slots in the other or second wall;

first and second insert plates, said first plate identified with a first distinguishing color and said second plate identified with a second distinguishing color different from said first color;

said insert plates having formed therein transversely extending slots on each side of equal depth for receiving circuit boards; and a pair of tabs projecting from opposite ends of each insert plate, each pair of tabs on an insert plate being insertable in a pair of aligned slots in said first and second side walls of said box; each pair of tabs being offset from a plane running through the center of each insert plate; the amount of offset of the tab on plate with the first distinguishing color being different from the amount of offset of the tab on the plate with the second distinguishing color.

6. A kit for assembling a container adapted to receive printed circuit boards, which comprises:

a box having a pair of opposed side walls, said opposed side walls having parallel, evenly spaced grooves with grooves on one side wall being aligned with the grooves on the other side wall;

a group of four insert plates, each plate of a first pair of said insert plates having a pair of tabs projecting from opposite edges thereof and fittable within a pair of said grooves formed in said opposed walls; each of said pair of tabs projecting from said first plates being offset from a center line plane running through each of said first pair of plates by a first predetermined amount, and each plate of the second pair of said insert plates having a pair of tabs projecting from opposite edges thereof and fittable within a pair of said grooves formed in said opposed walls, each of said pair of tabs projecting said second plates being offset from a center line plane running through each of said second pair of plates by a second predetermined amount which is different from said first predetermined amount;

said first pair of plates having a color marking indicative of said first predetermined amount of offset of said tabs on said first plates, and said second pair of plates having a color marking indicative of said second predetermined amount of offset of the tabs projecting from said second plates so that a pair of plates may be selected by color to provide different combinations of tab offsets and then assembled with the tabs resting in said grooves and said plates being spaced apart a distance closely approximating the width of a circuit board; and said plates each having a series of parallel evenly spaced grooves to receive printed circuit boards therein when said plates are inserted in the grooves in said side walls.

7. A kit as defined in claim 6 wherein the tops of said plates are imprinted with two characters, associated with the grooves on the opposite sides of said plates for indicating the respective sides of the board.

8. A kit as defined in claim 7 wherein a first of said characters indicates the plate side closest to the offset tabs while a second of said characters indicates the plate side furthest from the offset tabs to enable the selection of a pair of color coded plates and the side facings of said selected plates for subsequent insertion of said selected plates in said grooves of said box to provide the snuggest fit for circuit boards placed in said facing grooves of said inserted plates.

9. A kit as defined in claim 8 wherein said box is provided with a bottom wall on which is imprinted a chart depicting decimals representing portions of a unit of measurement of the width of a circuit board together with an indication of the color of the boards that are to be selected and inserted in said side wall grooves and the characters associated with the facing sides of the boards to be inserted in side wall grooves to provide a plate spacing to snugly hold the boards in said spaced plate grooves.

* * * * *

UNITED STATES PATENT AND TRADEMARK OFFICE
CERTIFICATE OF CORRECTION

PATENT NO. : 4,506,785

DATED : March 26, 1985

INVENTOR(S) : R. L. Seefeldt

It is certified that error appears in the above—identified patent and that said Letters Patent is hereby corrected as shown below:

Abstract, line 5, "Thee" should read --The--.

Column 1, line 9, "particular" should read --particularly--.

Column 3, line 61, "$10^{14}$" should read --$10^{13}$--.

Signed and Sealed this

Sixth Day of August 1985

[SEAL]

Attest:

DONALD J. QUIGG

*Attesting Officer*   *Acting Commissioner of Patents and Trademarks*